United States Patent
Willer et al.

(10) Patent No.: US 7,538,411 B2
(45) Date of Patent: May 26, 2009

(54) INTEGRATED CIRCUIT INCLUDING RESISTIVITY CHANGING MEMORY CELLS

(75) Inventors: Josef Willer, Riemerling (DE); Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 170 days.

(21) Appl. No.: 11/411,994

(22) Filed: Apr. 26, 2006

(65) Prior Publication Data

US 2007/0254428 A1 Nov. 1, 2007

(51) Int. Cl.
*H01L 29/00* (2006.01)

(52) U.S. Cl. .............................. 257/536; 257/E27.009; 438/238

(58) Field of Classification Search ...................... 257/1, 257/2, 3, 41, 499, 528, 529, 530, 536, 537, 257/538, 613, 614, 615, 616, E27.001, E27.009; 438/48, 57, 93, 95, 142, 197, 238, 239–249, 438/800, 900
See application file for complete search history.

(56) References Cited

U.S. PATENT DOCUMENTS

| | | | |
|---|---|---|---|
| 6,759,267 B2 | 7/2004 | Chen | |
| 2003/0086291 A1 | 5/2003 | Lowrey | |
| 2003/0234449 A1* | 12/2003 | Aratani et al. | 257/758 |
| 2004/0012008 A1* | 1/2004 | Chen | 257/2 |
| 2004/0113192 A1 | 6/2004 | Wicker | |
| 2004/0166604 A1* | 8/2004 | Ha et al. | 438/102 |
| 2004/0208038 A1* | 10/2004 | Idehara | 365/100 |

FOREIGN PATENT DOCUMENTS

DE 10236439 2/2004

OTHER PUBLICATIONS

Pagnia, H., et al., "Bistable Switching in Electroformed Metal-Insulator-Metal Devices," phys. stat. sol. (a) 108, 11 (1988), pp. 11-65.
Baek, I.G., et al., "Highly Scalable Non-volatile Resistive Memory using Simple Binary Oxide Driven by Asymmetric Unipolar Voltage Pulses," 2004 IEEE, 4 pages.
Kund, M., et al., Conductive Bridging RAM (CBRAM): An emerging non-volatile memory technology scalable to sub 20nm,: 2005 IEEE, 4 pages.

* cited by examiner

*Primary Examiner*—Evan Pert
*Assistant Examiner*—Kevin Quinto
(74) *Attorney, Agent, or Firm*—Dicke, Billig, Czaja PLLC

(57) ABSTRACT

Wordline stacks are arranged parallel at a distance from one another on a substrate surface. Bitlines are arranged transversely to the wordline stacks at a distance from one another. Source/drain regions are formed as doped regions in the vicinity of the wordline stacks. A resistive layer is disposed between a plurality of the source/drain regions and the bitlines and formed of a material having a resistance that is switched by an applied voltage. Source lines are arranged parallel to the wordline stacks so that they connect further pluralities of the source/drain regions.

18 Claims, 9 Drawing Sheets

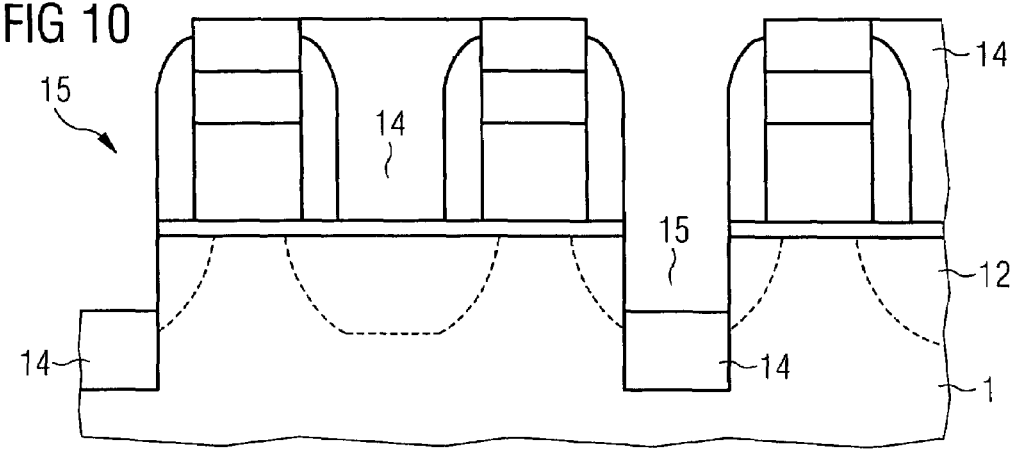
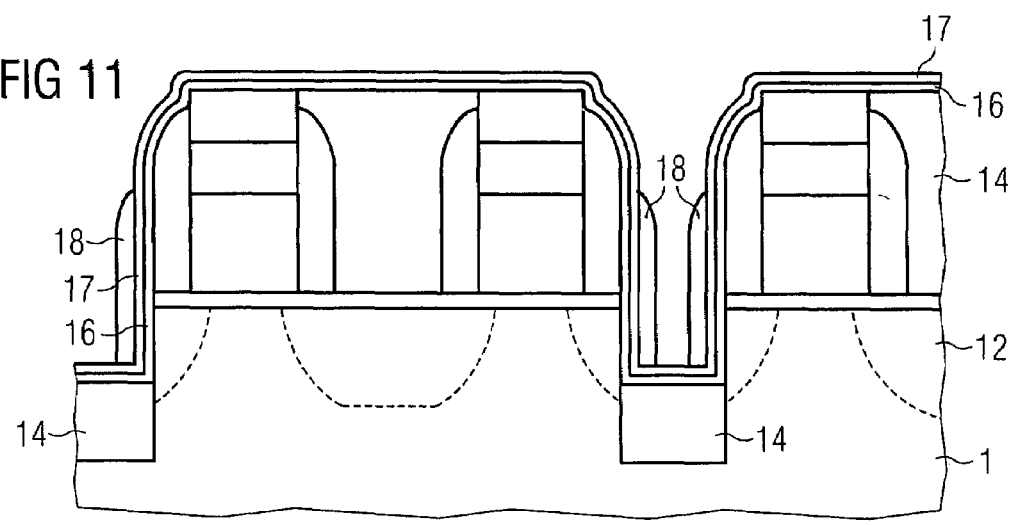
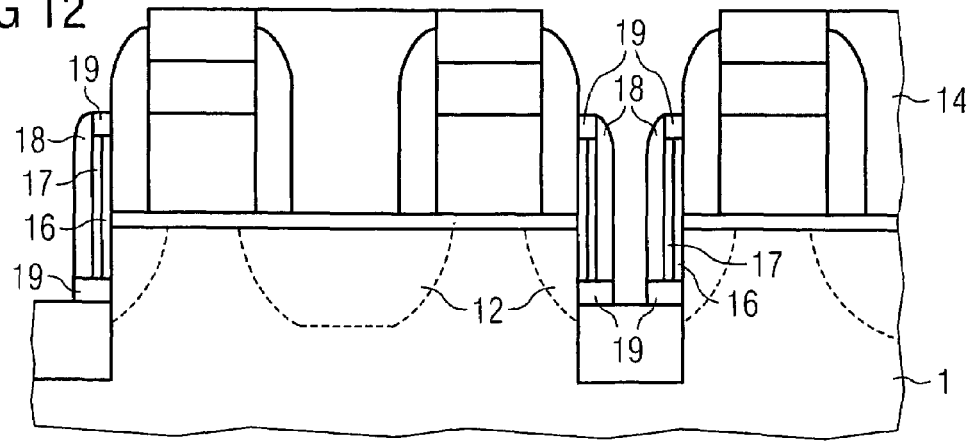

US 7,538,411 B2

INTEGRATED CIRCUIT INCLUDING RESISTIVITY CHANGING MEMORY CELLS

TECHNICAL FIELD

The present invention concerns semiconductor memory devices with resistive storage means and a method of production of memory devices.

BACKGROUND

Electrically writable and erasable non-volatile memories can be realized with storage means comprising alterable resistive elements. Resistive memories have extensively been studied for device applications in the past. Especially many transition metal oxides have been shown to exhibit a memory switching mechanism, which can be activated by pulses of reasonably small voltages and currents. A transition metal oxide structure typically consists of a metal/insulator/metal layer scheme with noble metal electrodes and reactively sputtered or plasma-oxidized thin metal oxide layers.

In the paper by I. G. Baek, et al., "Highly Scalable Nonvolatile Resistive Memory using Simple Binary Oxide Driven by Asymmetric Unipolar Voltage Pulses", IEDM 2004, which is incorporated herein by reference, a device structure is described that comprises storage means formed from transition metal oxide of binary composition. A layer sequence comprising transition metal oxide is arranged within the intermetal dielectric between the metalization levels M0 and M1. The bitlines are arranged in the metalization level M1. The memory element is connected with a source/drain region of a transistor structure. The second source/drain region is connected with the ground potential.

In the paper by M. Kund, et al., "Conductive bridging RAM (CBRAM): An emerging non-volatile memory technology scalable to sub 20 nm", in EEDM 2005, 31-5, which is incorporated herein by reference, a random access memory is described that makes use of a solid-state electrolyte. A chalcogenide layer, especially GeSe, is arranged between a bottom electrode of tungsten and a top electrode of silver. The switching mechanism is based on the polarity-dependent electrochemical deposition and removal of metal in a thin solid-state electrolyte film. The ON state is achieved by applying a positive bias larger than the threshold voltage at the oxidizable anode resulting in redox reactions driving Ag ions into the chalgogenide glass. This leads to the formation of metal-rich clusters, which form a conductive bridge between the electrodes. The device can be switched back to the OFF state by applying an opposite voltage, by which the metal ions are removed, so that the conductive bridge vanishes.

SUMMARY OF THE INVENTION

The semiconductor resistive memory device has a substrate with a surface, on which wordline stacks are arranged parallel to one another and at a distance from one another. Bitlines are arranged transversely to the wordlines at a distance from one another. Source/drain regions are formed as doped regions in the vicinity of the wordline stacks. A resistive layer is disposed between a plurality of the source/drain regions and the bitlines. Source lines are arranged parallel to the wordline stacks and connect further pluralities of the source/drain regions.

The method of production of resistive memory devices makes use of a substrate of semiconductor material having a surface. Wordline stacks are arranged parallel to one another and at a distance from one another on the surface to form interspaces between them. Doped regions are formed in the substrate in the vicinity of the wordline stacks. Recesses in the substrate are formed in every second interspace between the wordline stacks. A resistive memory layer is applied on the doped regions within the recesses. An electrically conductive material is applied on the layer sequence thus filling the recesses. The electrically conductive material is structured to form bitlines that run transversely to the wordline stacks.

These and other features of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 10 shows a cross-section according to FIG. 9 after the formation of a further recess;

FIG. 11 shows a cross-section according to FIG. 10 after the application of a resistive layer sequence;

FIG. 12 shows a cross-section according to FIG. 11 after the structuring of the resistive layer sequence;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
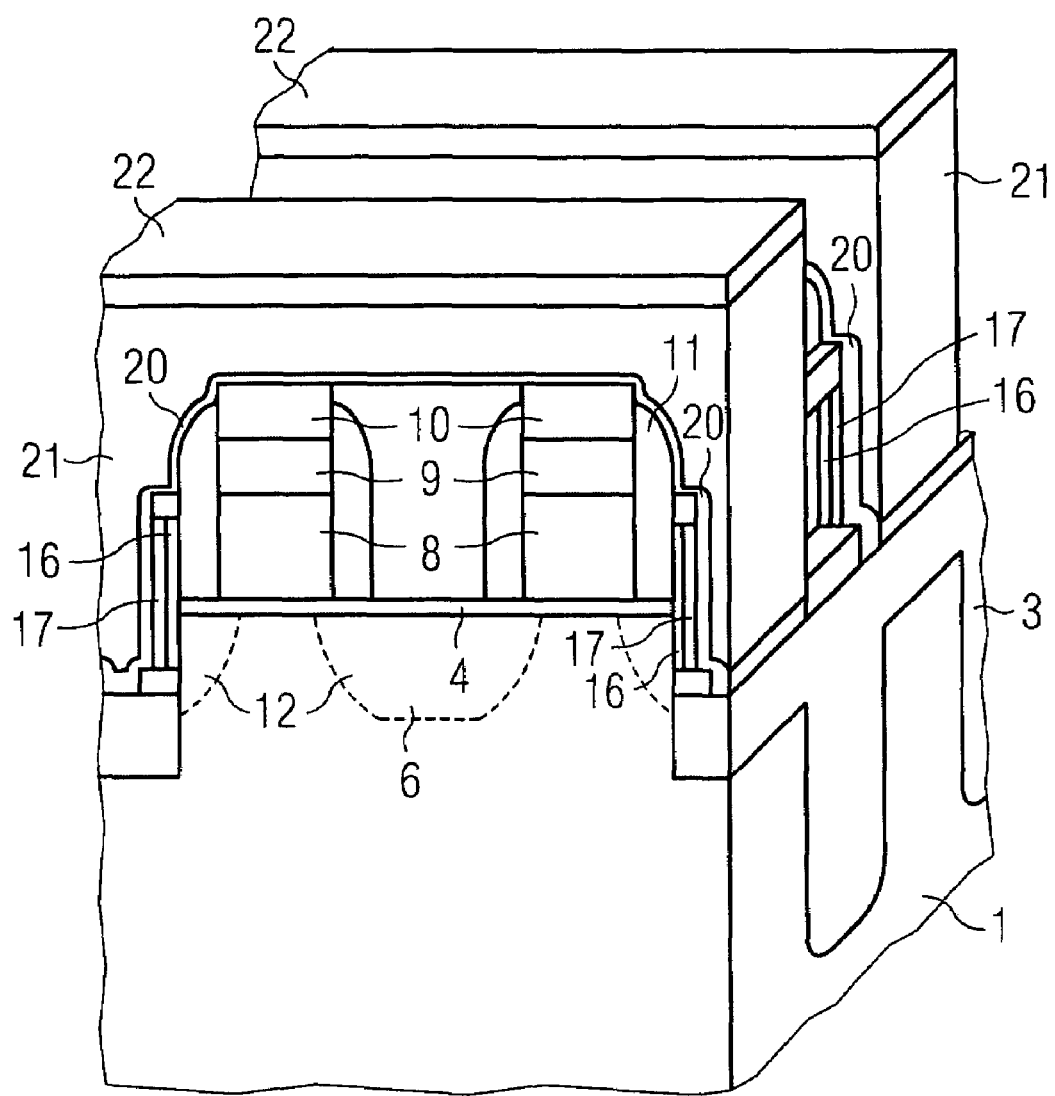
FIG. 1 shows a perspective cross-section of an embodiment of the device.

FIG. 1 shows a perspective cross-section of an embodiment of the semiconductor resistive memory device. A substrate 1 of semiconductor material is provided with shallow trench isolations 3. They are arranged parallel to one another and at a distance from one another. The shallow trench isolations separate active areas of the device. The upper surface of the semiconductor material is provided with a gate dielectric 4. Diffusion regions 12 provide source/drain regions and, in this embodiment, also buried source lines 6. The buried source lines 6 connect the source/drain regions of the individual memory cells and are arranged parallel to the wordline stacks. The wordline stacks are, in this example, shown to have a first wordline layer 8, which is preferably electrically conductively doped polysilicon, a second wordline layer 9, which is provided to reduce the track resistance and may include a metal, and an upper wordline insulation 10, which separates the conductive wordlines from the further conductive material above. The sidewalls of the wordline stacks are electrically insulated by sidewall spacers 11. The upper wordline insulations 10 and the sidewall spacers 11 can be nitride, for example.

Recesses are formed in every second interspace between the wordline stacks, where layer sequences are arranged in contact with the diffusion regions 12. An optional bottom electrode layer 16 is formed of electrically conductive material. The bottom electrode layer 16 is in contact with the doped semiconductor material of the diffusion regions 12. A resistive layer 17 is applied on the bottom electrode layer 16. The resistive layer 17 is a material that is suitable for a resistive memory layer. It can be a transition metal oxide, especially a binary transition metal oxide, a solid-state electrolyte, an organic material like a polymer or another material that is switchable between states of different resistances by means of an applied electric field. The resistive layer 17 is preferably covered with an upper electrode layer 20 of electrically conductive material. The upper electrode layer 20 is contact-connected with a contact layer 21, which is structured into bitlines preferably by means of a hardmask layer 22. Contact layer 21 can be a metalization layer, electrically conductively doped polysilicon or both. The gaps between the bitlines are preferably filled with a dielectric material, for example BPSG (boron phosphorous silicate glass), not shown in FIG. 1.

Figure 2:
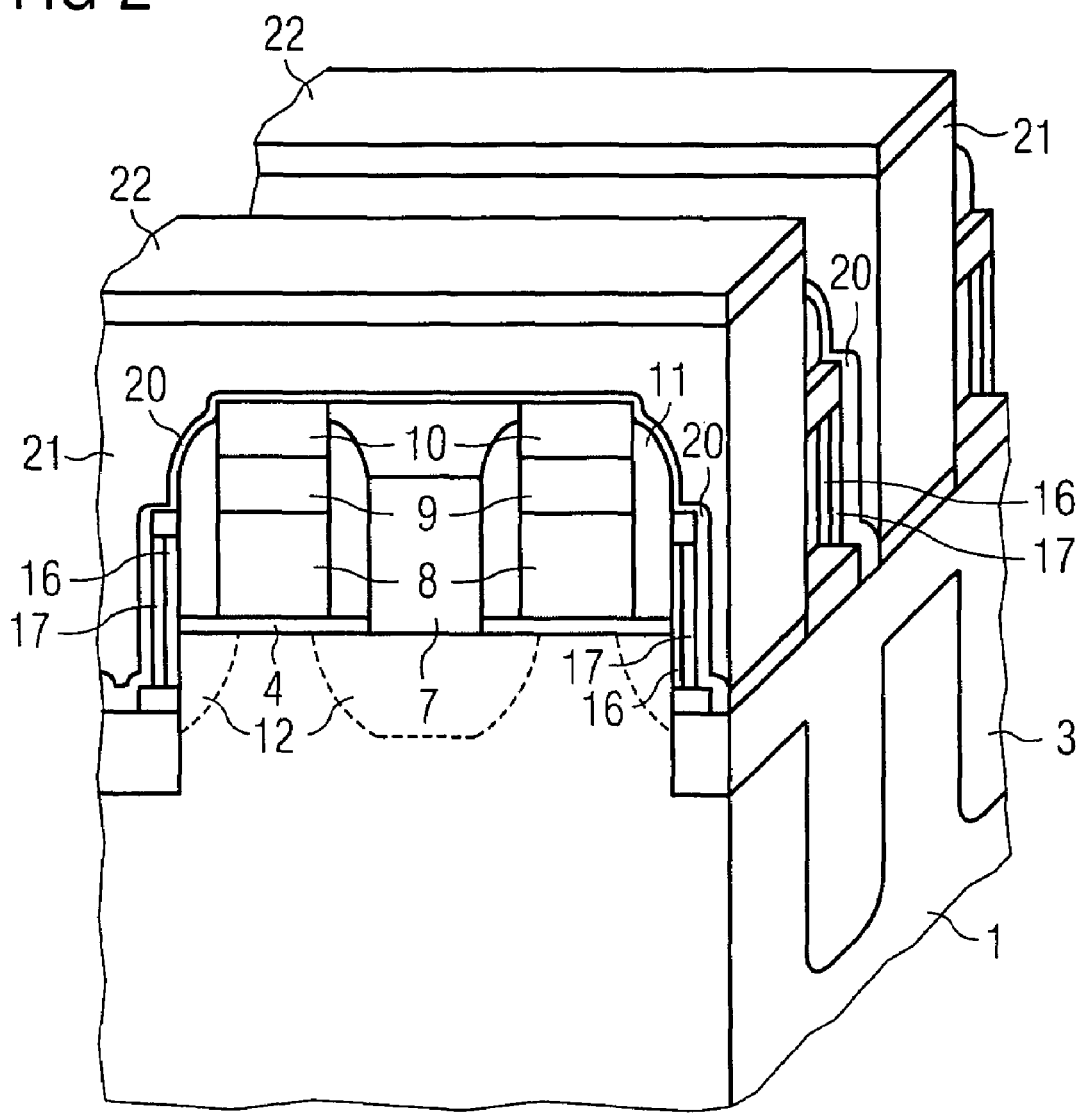
FIG. 2 shows a perspective cross-section according to FIG. 1 of a further embodiment.

FIG. 2 shows a further embodiment in a perspective cross-section similar to the cross-section of FIG. 1. In this embodiment, the source lines are formed by a source line layer 7, which is structured into conductor tracks in interspaces between the wordline stacks and connected to the diffusion regions 12 forming the source/drain regions. The source line layer 7 can be applied additionally to buried source lines according to the previously described embodiment. But it is also possible to have separate source/drain regions, which are connected only by the tracks of the source line layer 7.

It is apparent from FIG. 1 and FIG. 2 that the bitlines connect pluralities of source/drain regions via the intermediate layer sequence comprising the resistive layer 17, and that the source lines also connect pluralities of source/drain regions in a direction transverse to the bitlines and parallel to the wordlines. Thus, every memory cell can be addressed individually. This is shown in the circuit diagram of FIG. 3.

Figure 3:
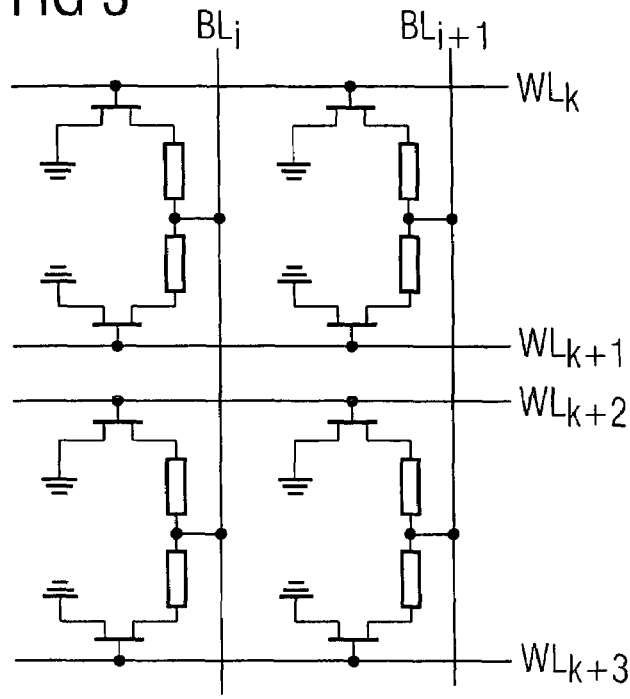
FIG. 3 shows a circuit diagram.

FIG. 3 shows a section of the circuit of the memory device, in which the individual memory cells are represented by the symbols of the resistances. The bitlines $BL_i$ are connected to pluralities of source/drain regions of transistor structures via the resistances that are provided as a storage means. The resistances are formed by the resistive layer 17. The other source/drain region of every memory cell transistor is connected to the grounding potential. The channels are controlled by the gate electrodes, pluralities of which are connected by the wordlines $WL_k$. Any individual memory cell can be addressed by a selection of one bitline and one wordline. The grounding is provided by the source lines. The source lines connect the source/drain regions, which are common to the memory cells that are addressed by two neighboring wordlines.

Figure 4:
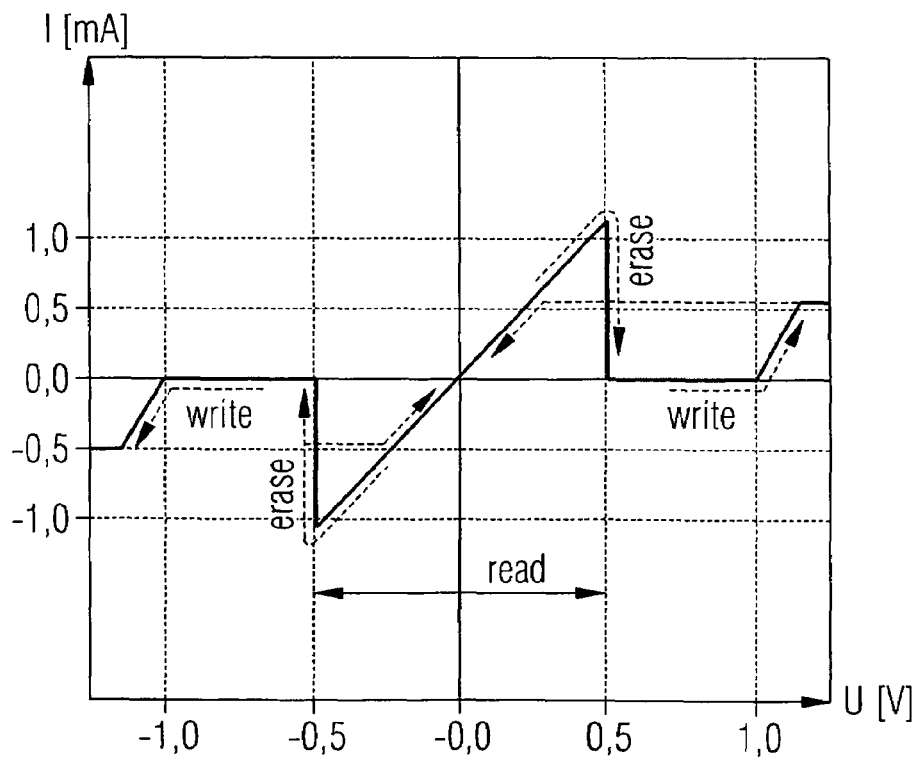
FIG. 4 shows a voltage/current diagram.

FIG. 4 shows a voltage/current diagram corresponding to FIG. 3 of the paper of I. G. Baek, et al. The diagram shows the voltages that are applied in the write, read, and erase steps and the corresponding currents. The voltages ranging from zero to the reset threshold can be used for reading.

Figure 5:
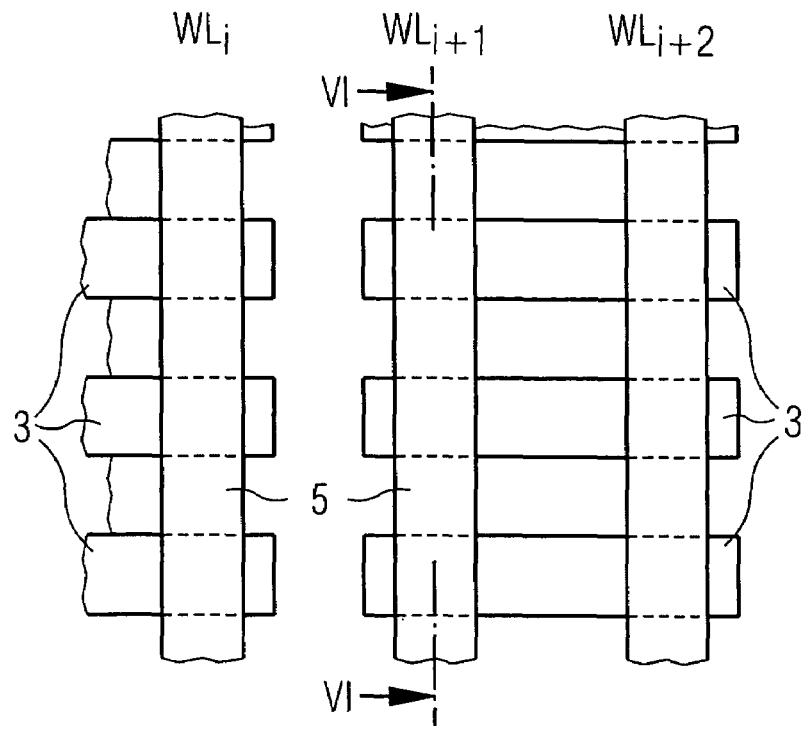
FIG. 5 shows a plan view onto the arrangement of wordlines and shallow trench isolations of a first embodiment.

FIG. 5 shows a plan view onto a section of a first intermediate product of the semiconductor resistive memory device. The substrate surface is shown without the gate dielectric 4 so that the arrangement of the shallow trench isolations 3 is shown. The shallow trench isolations 3 have a longitudinal extension transverse to the wordline stacks 5 and are interrupted under every second interspace between the wordline stacks. Thus it is possible to form a diffusion region that is provided as a source line in the area where the shallow trench isolations 3 are interrupted. The position of the wordline stacks 5 forming the wordlines $WL_j$ is also shown in FIG. 5. The wordline stacks 5 are preferably disposed at constant distances.

Figure 6:
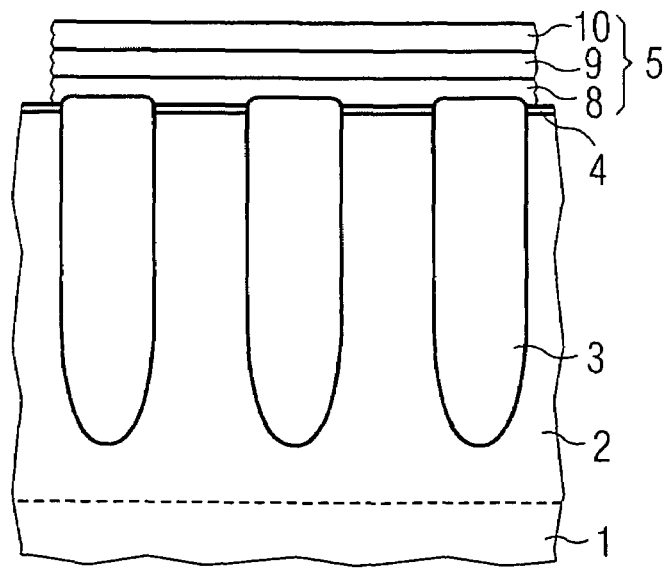
FIG. 6 shows a cross-section indicated in FIG. 5 of a first intermediate product.

FIG. 6 shows the cross-section indicated in FIG. 5, taken through one of the wordline stacks. The substrate 1 is provided with a doped well 2, in which the memory cells are disposed. The well 2 can be doped for a type of electrical conductivity that is opposite to a basic doping of the substrate 1, for example. The cross-section of FIG. 6 also shows the arrangement of the shallow trench isolations 3. The surface is covered with a gate dielectric 4 at least in the areas of the wordline stacks 5. The wordline stacks 5 have one or several layers, preferably including a first wordline layer 8, which also functions as gate electrodes and can be doped polysilicon, for example, a second wordline layer 9, which reduces the track resistance and can comprise a metal, for example, and possibly further electrically conductive layers. An upper wordline insulation 10 can be formed by a layer of nitride, for example, and is provided to insulate the wordlines from electrically conductive material that is applied above.

Figure 7:
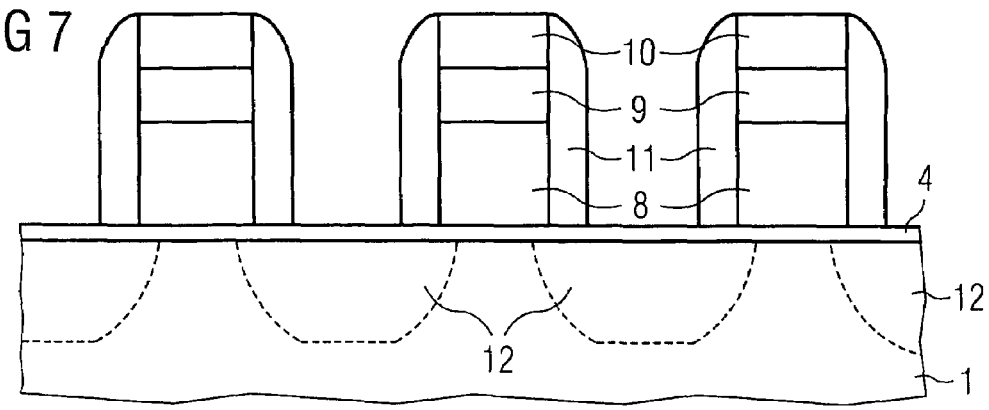
FIG. 7 shows a cross-section perpendicular to the cross-section of FIG. 6.

FIG. 7 shows a cross-section perpendicular to the cross-section of FIG. 6 across the wordline stacks. The surface of the substrate 1 is covered with the gate dielectric 4, which separates the wordline stacks from the semiconductor material. The first and second wordline layers 8, 9 are covered with the upper wordline insulation 10 and are electrically insulated on both sides by sidewall spacers 11. The sidewall spacers 11 can also be nitride. The diffusion regions 12 are preferably formed by implantations of doping atoms, at least partially before the sidewall spacers 11 are applied. The diffusion regions 12 are provided for the source/drain regions of the individual memory cells and can especially be provided as buried source lines running continuously along the direction of the wordline stacks. The formation of the buried source lines in this embodiment makes use of the interruptions of the shallow trench isolations 3 shown in FIG. 5.

Figure 8:
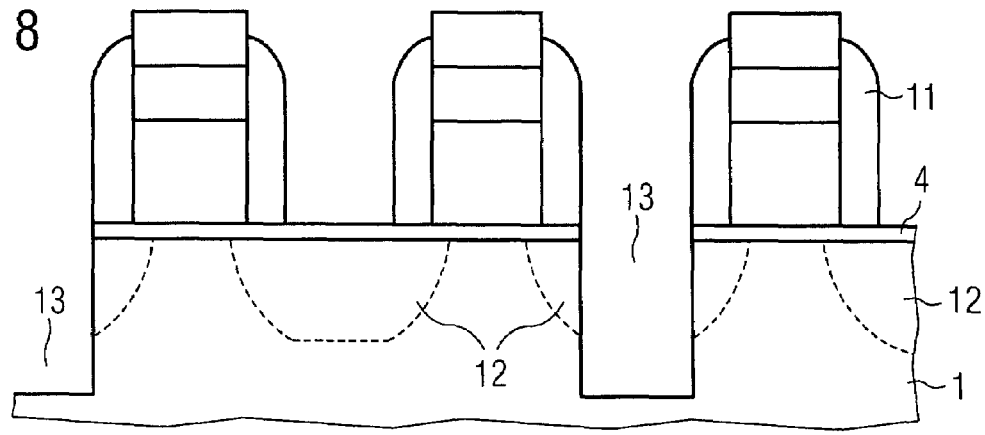
FIG. 8 shows a cross-section according to FIG. 7 after the formation of recesses.

In a further process step according to the cross-section of FIG. 8, recesses 13 are formed in every second interspace between the wordline stacks. This step can be performed by the application of suitable hardmasks that are structured by a lithography known per se. The semiconductor material is preferably removed by a selective RIE (reactive ion etching) step, which cuts through the diffusion region 12, as shown in FIG. 8.

Figure 9:
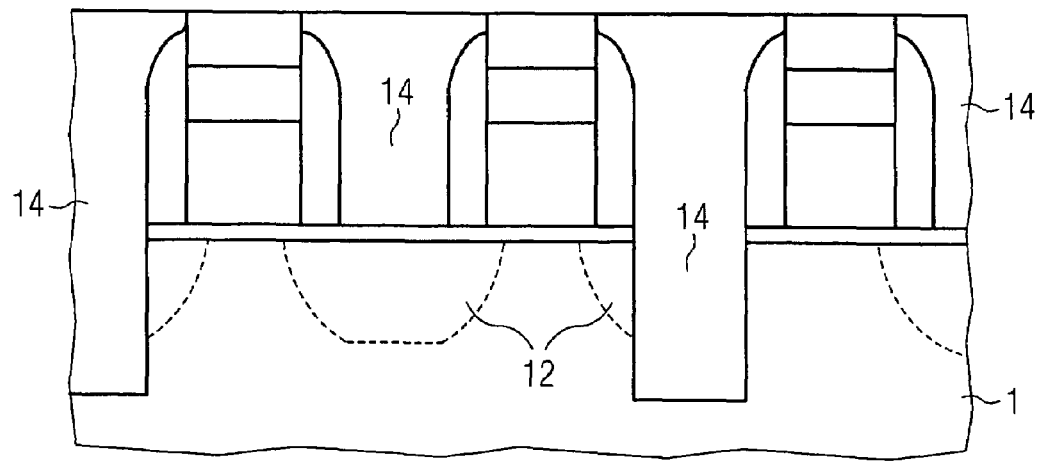
FIG. 9 shows a cross-section according to FIG. 8 after the application of a recess filling.

As shown in FIG. 9, the recesses 13 and the other interspaces between the wordline stacks are filled with a suitable filling 14, for example an oxide, which is preferably planarized by CMP (chemical mechanical polishing).

As shown in FIG. 10, a further lithography step is applied to form further recesses 15 in the areas in which the resistances of the memory cells are to be disposed. If the filling 14 is an oxide, it can be removed by RIE. In this step, a trench is obtained because the oxide of the shallow trench isolations 3 is also removed. A certain volume of the filling 14 can remain at the bottom of the trenches as shown in FIG. 10, in order to isolate the transistors in the direction transverse to the wordline stacks.

FIG. 11 shows a cross-section according to FIG. 10 after further process steps. Contact layers like Ti/TiN for ohmic contacts to the junction can optionally be applied first. A bottom electrode layer 16 of electrically conductive material is preferably also applied. A resistive layer 17 provided as memory layer is applied onto the bottom electrode layer 16. In a first variant of this embodiment, a spacer mask 18 is formed on the resistive layer 17. The bottom electrode layer 16 is preferably a noble metal like platinum. The resistive layer 17 can be a transition metal oxide, a solid-state electrolyte or an organic material like a polymer, for example. In principle, any material that is suitable for resistive memories can be applied to form the resistive layer 17. The spacer mask 18 is preferably formed from a deposited mask layer, which is subsequently etched back into the shape of the spacers. This sequence of process steps is the preferred variant of the manufacturing process of this embodiment. In another variant of this embodiment, the upper electrode layer 20 can be applied directly after the deposition of the resistive layer 17 and can be structured together with the other layers by means of the spacer mask 18.

FIG. 12 shows a cross-section of a further intermediate product after an etching step, for example a wet etching step, by which the resistive layer 17 and the bottom electrode layer 16 are partially removed to leave only the portions shown in FIG. 12. Preferably a thin isolation layer, for example an oxide, is deposited onto the upper edges of the remaining layer portions and into the lateral openings that are produced by the etching step at the lower edges of the remaining layer portions at the bottoms of the recesses. The isolation layer is then etched back, for example by RIE, to form the small store insulations 19, which ensure a good electric insulation at the edges of the remaining layer portions.

Figure 13:
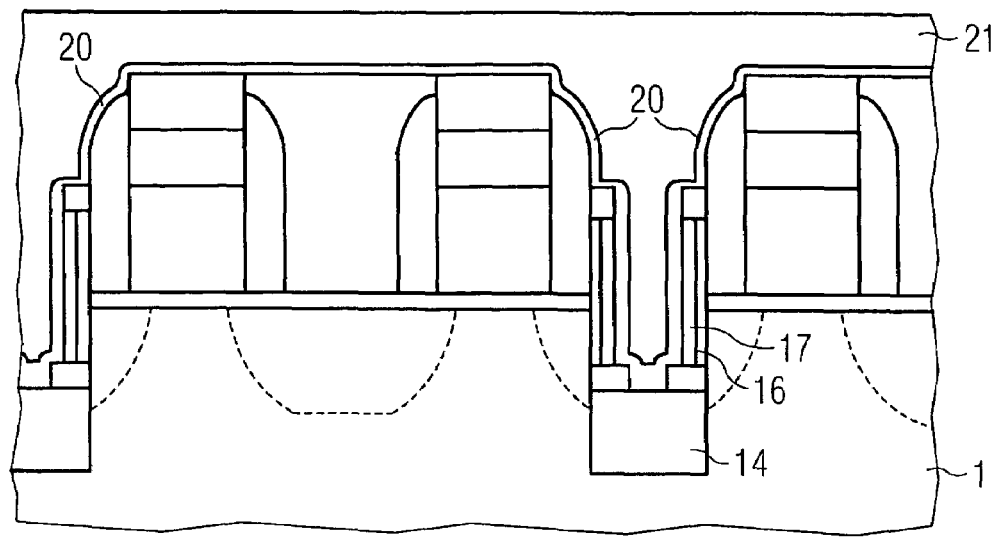
FIG. 13 shows a cross-section according to FIG. 12 after the application of a metalization.

FIG. 13 shows a cross-section after the selective removal of the spacer mask 18, the deposition of an upper electrode layer 20, which can be, for example, platinum, and the application of a contact layer 21. The contact layer 21 can be a metalization layer, for example, like a layer sequence of Ti/TiN/W, or electrically conductively doped polysilicon. The contact layer can also include both a metal and conductive polysilicon. Then a hardmask layer is applied and structured into the structure that is provided for the bitlines by means of a resist layer.

Figure 14:
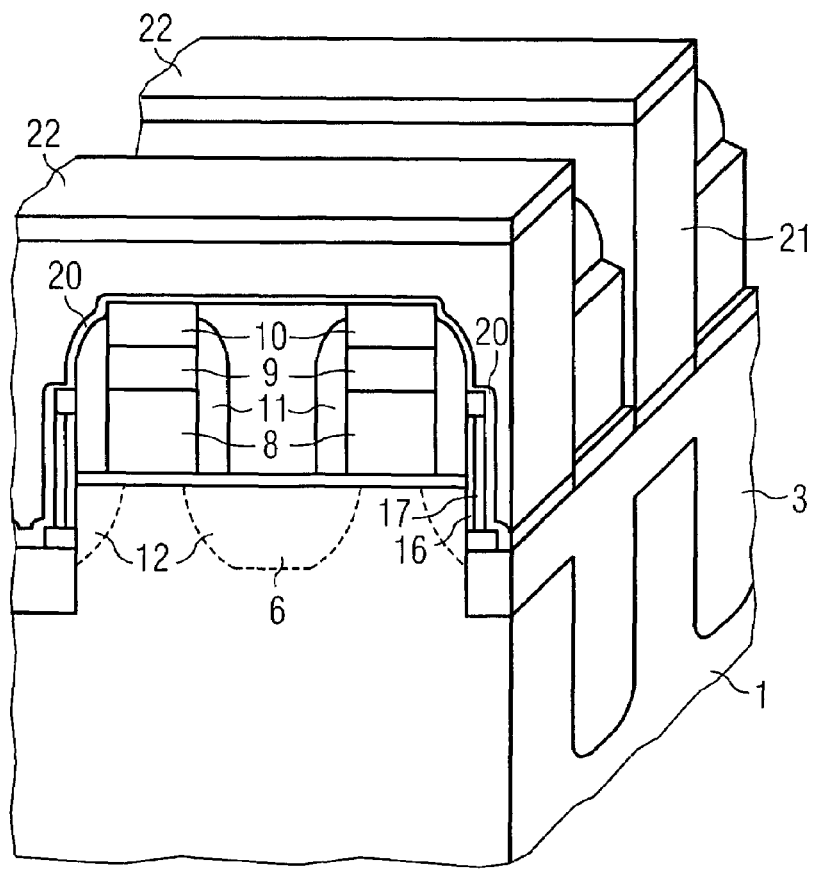
FIG. 14 shows a perspective cross-section according to FIG. 1 for the intermediate product obtained after a structuring of the metalization.

This is shown in a perspective cross-section in FIG. 14, which shows the device after the structuring of the bitlines by means of the hardmask layer 22. The contact layer 21 is thus separated into the bitlines, which connect pluralities of source/drain regions via the layer sequence of the upper electrode layer 20, the resistive layer 17, and the bottom electrode layer 16. After the structuring of the contact layer 21 into the bitlines, the upper electrode layer 20, the resistive layer 17, and the bottom electrode layer 16 are removed in the spaces between the bitlines. This can be done by a wet chemical etching or other suitable chemistry. The process can then be continued in a conventional way with the application of intermetal dielectric layers and further metalizations known per se.

Figure 15:
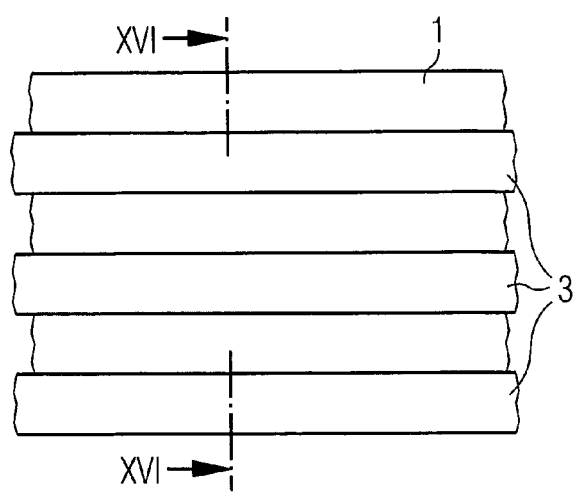
FIG. 15 shows a plan view according to FIG. 5 for a further embodiment.

FIG. 15 shows a plan view onto an arrangement of the shallow trench isolations 3 for a further embodiment, in which the shallow trench isolations 3 are not interrupted and separate the active areas completely.

Figure 16:
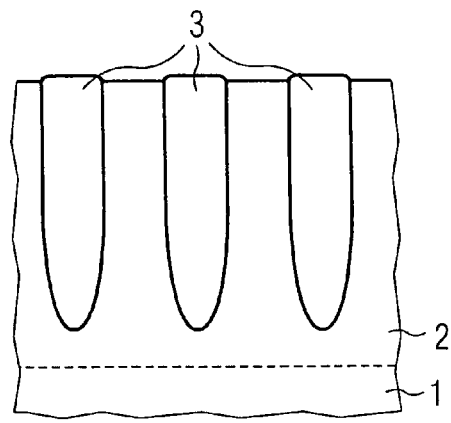
FIG. 16 shows the cross-section indicated in FIG. 15.

FIG. 16 shows the cross-section indicated in FIG. 15.

Figure 17:
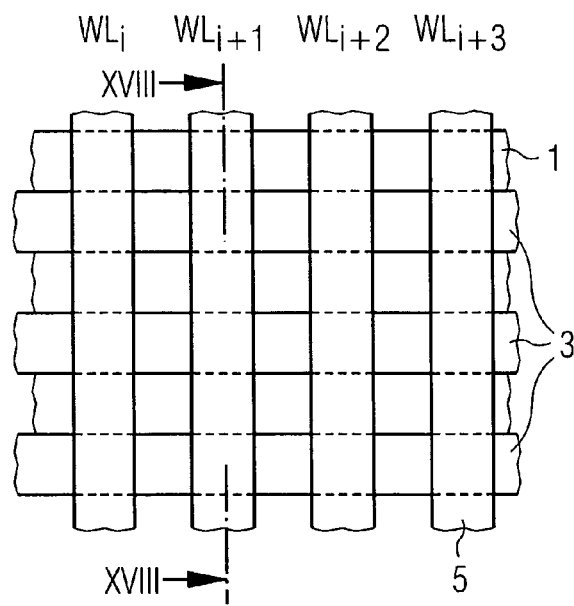
FIG. 17 shows a cross-section according to FIG. 15 after the application of the wordline stacks.

FIG. 17 shows the plan view according to FIG. 15 after the application of the wordline stacks 5.

Figure 18:
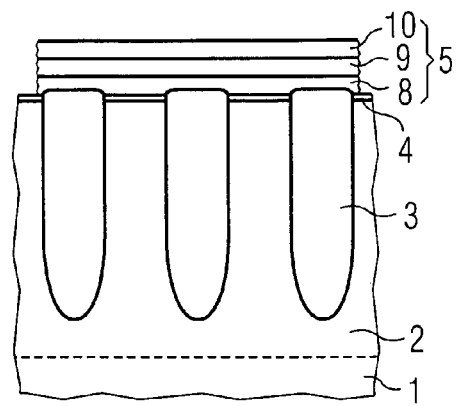
FIG. 18 shows the cross-section indicated in FIG. 17.

FIG. 18 shows the cross-section indicated in FIG. 17 and corresponding to the cross-section of FIG. 16. Cut through one of the wordline stacks, it is similar to the cross-section of FIG. 6 of the first embodiment.

Figure 19:
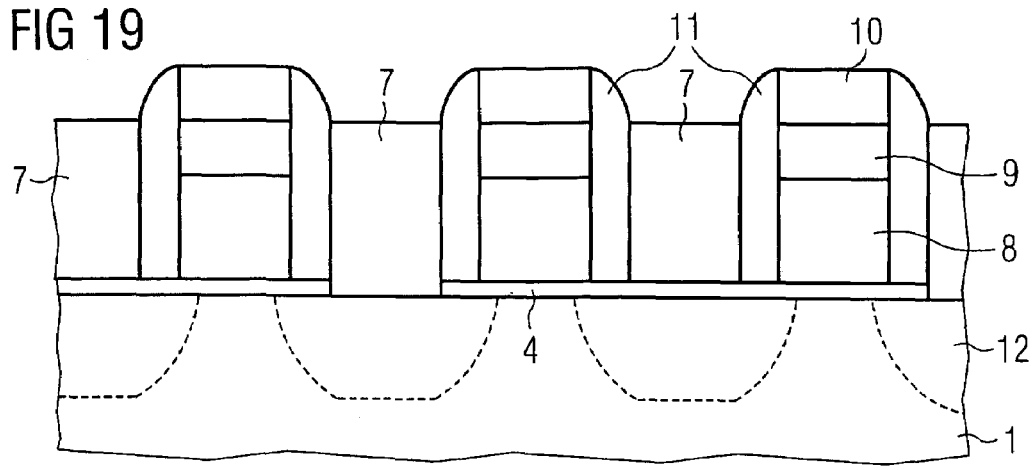
FIG. 19 shows a cross-section perpendicular to the cross-section of FIG. 18 after the application of a source line layer.

A lithography step is performed to open the gate dielectric 4 on the active areas, in which the source/drain regions are located that are to be connected by a corresponding source line. Then, a source line layer 7 of electrically conductive material is deposited as shown in the cross-section of FIG. 19. The source line layer 7 can be electrically conductively doped polysilicon, for example $n^+$ polysilicon. FIG. 19 shows that the source line layer 7 is deposited partially on the gate dielectric 4 and partially directly on the semiconductor material of the diffusion regions 12 to form electric connections to the diffusion regions 12 that are located in areas of every second interspace between two neighboring wordline stacks. The electric connections are arranged in a similar pattern as in the previously described embodiment. The recessed arrangement of the source line layer 7 as shown in FIG. 19 is obtained after a planarization of the electrically conductive material and a subsequent back-etching step. Then an isolation capping is deposited and planarized.

Figure 20:
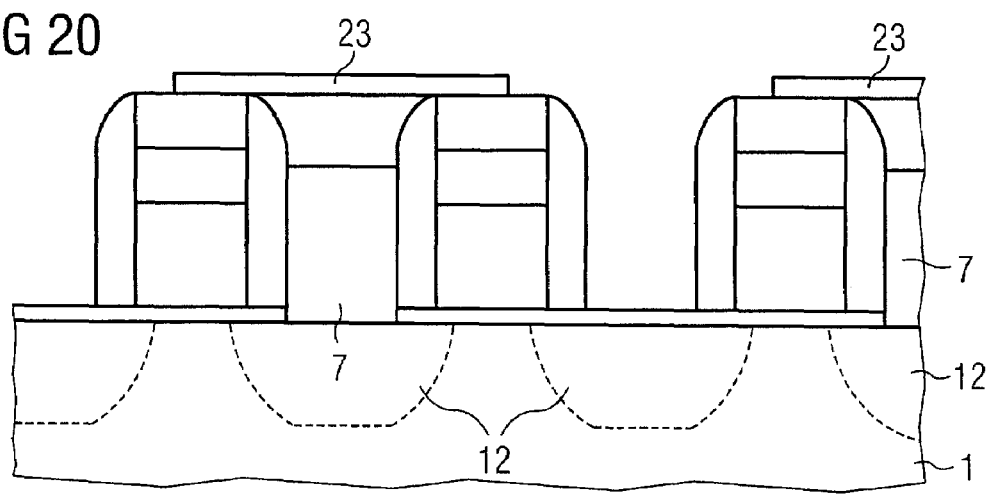
FIG. 20 shows a cross-section according to FIG. 19 after a partial removal of the source line layer.

The cross-section of FIG. 20 shows the application of a mask layer 23, which covers the source line layer 7 in every second interspace between the wordline stacks, where source lines are provided. The mask layer 23 can be a hardmask, which is structured by a lithography step, for example. The mask is used to remove the isolation capping and source line layer 7 at least in the areas that are provided for the disposition of the memory resistive layer.

Figure 21:
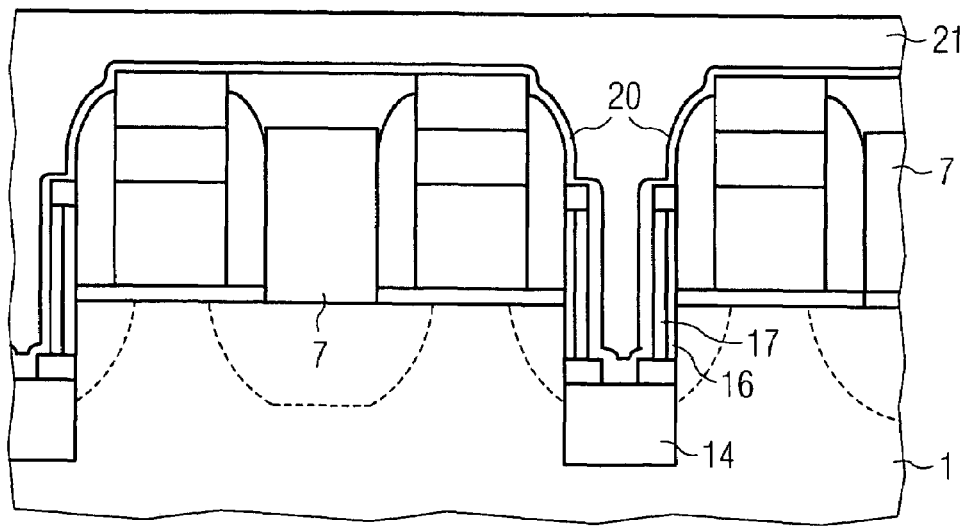
FIG. 21 shows a cross-section according to FIG. 13 for the further embodiment.

Then process steps similar to the steps shown in FIGS. 8 to 11 are performed to obtain the structure shown in FIG. 21. This cross-section corresponds to the cross-section of FIG. 13 of the first embodiment, with the difference that there are no buried source lines. Instead, there are residual parts of the source line layer 7, which form the source lines.

The second embodiment has the advantage that a smaller pitch can be obtained, since the interruptions of the shallow trench isolations as shown in FIG. 5 must allow for process tolerances in order to secure a continuous conductive path. The features of both described embodiments can also be combined to obtain source lines that are formed both by buried source lines and by a separately applied source line layer. In this case, the shallow trench isolations 3 are formed with the interruptions shown in FIG. 5.

This invention encompasses embodiments in which the resistive means is realized by polymer, molecular, bipolar or unipolar means.

Although the present invention and its advantages have been described in detail, it should be understood that various changes, substitutions and alterations can be made herein without departing from the spirit and scope of the invention as defined by the appended claims.

What is claimed is:

1. An integrated circuit, comprising:
a substrate comprising a surface;
wordline stacks arranged parallel at a distance from one another on the surface;
bitlines arranged transversely to the wordlines at a distance from one another;
source/drain regions formed as doped regions in the vicinity of the wordline stacks;
a layer sequence comprising a bottom electrode layer, a resistive layer, and an upper electrode layer disposed between a plurality of the source/drain regions and the bitlines, wherein the resistive layer is disposed in a plane that is vertical to the substrate surface and at least a part of the resistive layer is disposed in a recess of the substrate surface;
the upper electrode layer comprising separate sections;
the bottom electrode layer comprising separate sections corresponding to the sections of the upper electrode layer;
a bitline connecting a plurality of sections of the upper electrode layer; and
source lines arranged parallel to the wordline stacks, the source lines connecting further pluralities of the source/drain regions.

2. The integrated circuit according to claim 1, wherein the resistive layer comprises separate sections, every section being covered by one of the bitlines.

3. The integrated circuit according to claim 1, wherein the resistive layer comprises a transition metal oxide.

4. The integrated circuit according to claim 1, wherein the resistive layer comprises a solid-state electrolyte.

5. The integrated circuit according to claim 1, wherein the resistive layer comprises an organic material.

6. The integrated circuit according to claim 1, wherein the source lines comprise a source line layer of electrically conductive material.

7. The integrated circuit according to claim 6, wherein the source lines are arranged in self-aligned fashion with respect to the wordline stacks.

8. A method of production of resistive memory devices, comprising:
providing a substrate of semiconductor material comprising a surface;
forming wordline stacks on the surface, the wordline stacks being arranged parallel to one another and at a distance from one another to form interspaces;
forming doped regions in the substrate in the vicinity of the wordline stacks;
forming recesses in the substrate in every second interspace between the wordline stacks;
applying a resistive layer on the doped regions and providing an electric connection between the resistive layer and the doped regions;
applying an electrically conductive material filling the recesses; and
structuring the electrically conductive material to form bitlines running transversely to the wordline stacks.

9. The method according to claim 8, wherein the resistive layer is formed from a transition metal oxide.

10. The method according to claim 8, wherein the resistive layer is formed from a solid-state electrolyte.

11. The method according to claim 8, wherein the resistive layer is formed from an organic material.

12. The method according to claim 8, further comprising:
forming parallel shallow trench isolations in the substrate, the shallow trench isolations comprising longitudinal extensions transversely to the wordline stacks.

13. The method according to claim 8, wherein the doped regions are formed to comprise source/drain regions and source lines.

14. The method according to claim 8, further comprising:
applying a further layer of electrically conductive material to form source lines connecting pluralities of the doped regions.

15. The method according to claim 13, wherein the source lines are formed in self-aligned fashion with respect to the wordline stacks.

16. The method according to claim 14, wherein the source lines are formed in self-aligned fashion with respect to the wordline stacks.

17. A method of production of resistive memory devices, comprising:
providing a substrate of semiconductor material comprising a surface;
forming parallel wordline stacks on the surface comprising interspaces between the wordline stacks;
forming doped regions in the substrate in the vicinity of the wordline stacks;
forming recesses in the substrate in every second interspace between the wordline stacks;
applying a bottom layer of an electrically conductive material on the doped regions within the recesses;
applying a resistive layer on the bottom layer;
applying an upper layer of an electrically conductive material on the resistive layer;
applying a further electrically conductive material on the upper layer, filling the recesses; and
structuring the further electrically conductive material, the upper layer, the resistive layer, and the bottom layer to form bitlines and resistive memory cells.

18. An integrated circuit, comprising:
a substrate comprising a surface;
wordline stacks arranged parallel at a distance from one another on the surface;
bitlines arranged transversely to the wordlines at a distance from one another;
source/drain regions formed as doped regions in the vicinity of the wordline stacks; a layer sequence comprising a bottom electrode layer, a resistive layer, and an upper electrode layer disposed between a plurality of the source/drain regions and the bitlines;
the upper electrode layer comprising separate sections;
the bottom electrode layer comprising separate sections corresponding to the sections of the upper electrode layer;
a bitline connecting a plurality of sections of the upper electrode layer; and
source lines arranged parallel to the wordline stacks, the source lines connecting further pluralities of the source/drain regions,
wherein at least a part of the resistive layer is disposed in a recess of the substrate surface.

* * * * *